(12) United States Patent
DeKeyser

(10) Patent No.: US 9,861,003 B2
(45) Date of Patent: Jan. 2, 2018

(54) MOUNTING CLIP

(71) Applicant: US LED Ltd., Houston, TX (US)

(72) Inventor: Nicholas Joseph DeKeyser, Katy, TX (US)

(73) Assignee: US LED, Ltd., Houston, TX (US)

(*) Notice: Subject to any disclaimer, the term of this patent is extended or adjusted under 35 U.S.C. 154(b) by 16 days.

(21) Appl. No.: 15/135,281

(22) Filed: Apr. 21, 2016

(65) Prior Publication Data

US 2017/0311472 A1    Oct. 26, 2017

(51) Int. Cl.
| F21V 19/00 | (2006.01) |
| F21V 21/00 | (2006.01) |
| H05K 7/14 | (2006.01) |
| F16B 2/22 | (2006.01) |
| H05K 1/18 | (2006.01) |

(52) U.S. Cl.
CPC ............ *H05K 7/1417* (2013.01); *F16B 2/22* (2013.01); *H05K 1/18* (2013.01); *H05K 2201/10106* (2013.01)

(58) Field of Classification Search
USPC ........................................ 362/382
See application file for complete search history.

(56) References Cited

U.S. PATENT DOCUMENTS

| 3,066,367 A * | 12/1962 | Garman | F16B 5/06 174/158 R |
| 5,460,541 A * | 10/1995 | Weatherley | H01R 13/518 439/532 |
| 6,019,614 A * | 2/2000 | Baur | H05K 9/0039 439/883 |
| 6,124,552 A * | 9/2000 | Boe | H05K 7/142 174/135 |
| 6,312,275 B1 * | 11/2001 | Tortorella | H01R 13/6395 361/759 |
| 6,688,892 B2 * | 2/2004 | Fukumoto | H01R 13/04 439/65 |
| 6,746,254 B2 * | 6/2004 | Hooper | H05K 7/142 174/138 G |
| 2003/0085056 A1 * | 5/2003 | Goldstein | H02G 3/32 174/260 |
| 2004/0037077 A1 * | 2/2004 | Showers | G09F 13/04 362/249.01 |
| 2010/0110680 A1 * | 5/2010 | Bianco | F21V 17/107 362/235 |
| 2010/0144215 A1 * | 6/2010 | Schmitz | H01R 4/183 439/816 |
| 2012/0087122 A1 * | 4/2012 | Takeuchi | G02F 1/133603 362/235 |
| 2013/0039065 A1 * | 2/2013 | Okabe | H05K 3/202 362/249.02 |
| 2013/0053486 A1 * | 2/2013 | Dower | C08L 91/00 524/110 |
| 2014/0315422 A1 * | 10/2014 | Hunt | H01R 4/64 439/489 |

* cited by examiner

*Primary Examiner* — Tuyen K Vo
(74) *Attorney, Agent, or Firm* — Blank Rome, LLP

(57) ABSTRACT

A flexible mounting clip is configured for engaging with a circuit board for removably attaching the circuit board to a mounting surface. A rib on an arm of the mounting clip engages with an opening in the circuit board to position and hold the circuit board in place, allowing easy replacement of the circuit board without tools.

18 Claims, 8 Drawing Sheets

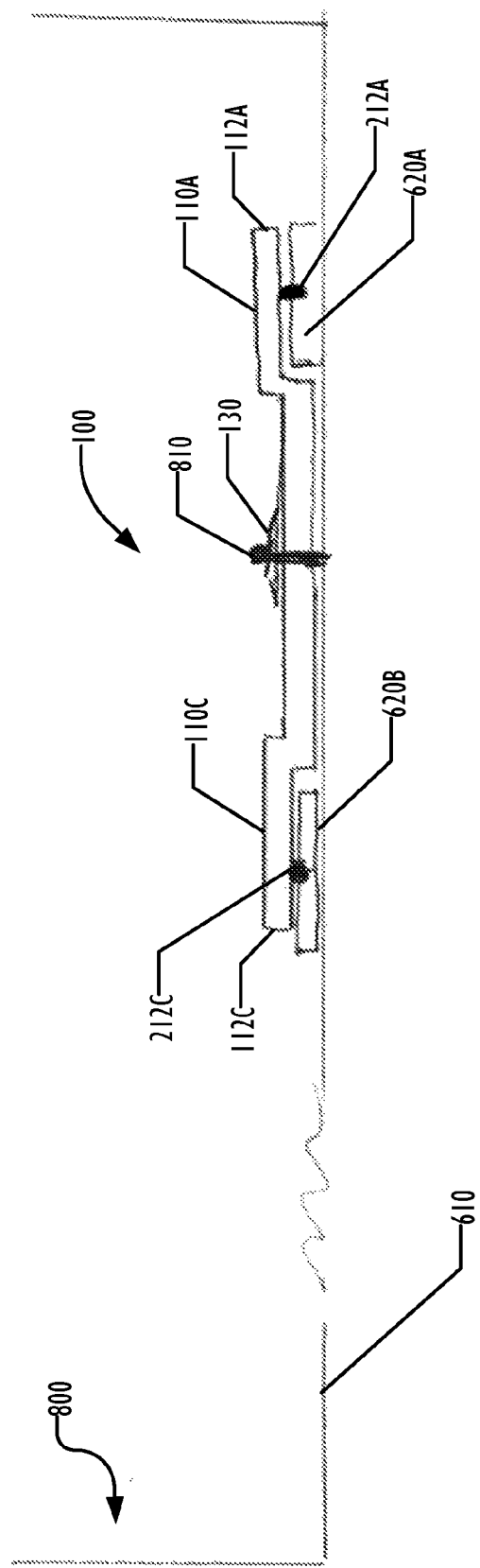

MOUNTING CLIP

TECHNICAL FIELD

The present invention relates to the field of lighting, and in particular to a mounting clip for mounting circuit boards in LED lighting fixtures.

BACKGROUND ART

As light emitting diode (LED) lighting fixtures become more and more common, manufacturers have looked for better ways of mounting LED circuit boards in the fixtures. Conventional techniques include mechanical fasteners such as rivets or screws to secure the circuit boards to the fixture, but this has been observed to cause bowing or flexing of the circuit boards, resulting in undesirable light patterns or poor thermal conduction to the fixture. Riveting or screwing circuit boards to a fixture takes time, and quicker ways for mounting circuit boards in fixtures have been desired. In addition, considerable effort is needed to replace a circuit board that is riveted, screwed, or otherwise directly attached to the fixture, and ways to make replacement easier would be desirable.

BRIEF DESCRIPTION OF DRAWINGS

The accompanying drawings, which are incorporated in and constitute a part of this specification, illustrate an implementation of apparatus and methods consistent with the present invention and, together with the detailed description, serve to explain advantages and principles consistent with the invention. In the drawings.

FIG. 8 is a cutaway view of a mounting clip and two circuit boards mounted in an LED light fixture according to one embodiment.

DESCRIPTION OF EMBODIMENTS

In the following description, for purposes of explanation, numerous specific details are set forth in order to provide a thorough understanding of the invention. It will be apparent, however, to one skilled in the art that the invention may be practiced without these specific details. In other instances, structure and devices are shown in block diagram form in order to avoid obscuring the invention. References to numbers without subscripts are understood to reference all instance of subscripts corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

In the following "top" is considered to be the side of an object away from a mounting surface of an LED light fixture, and "bottom" is considered to be the side of the object towards the mounting surface. However, these designations are arbitrary, and, for example, the "top" side may be closer to a surface of the earth than the "bottom" side, or in any other orientation to a surface of the earth, depending on the orientation of mounting surface of the light fixture.

Although described herein in terms of an LED light fixture application, the invention is not so limited, and may be used in any application in which circuit boards are to be attached to a surface, using mounting clips to hold the circuit boards, while allowing easy removal.

Figure 1:
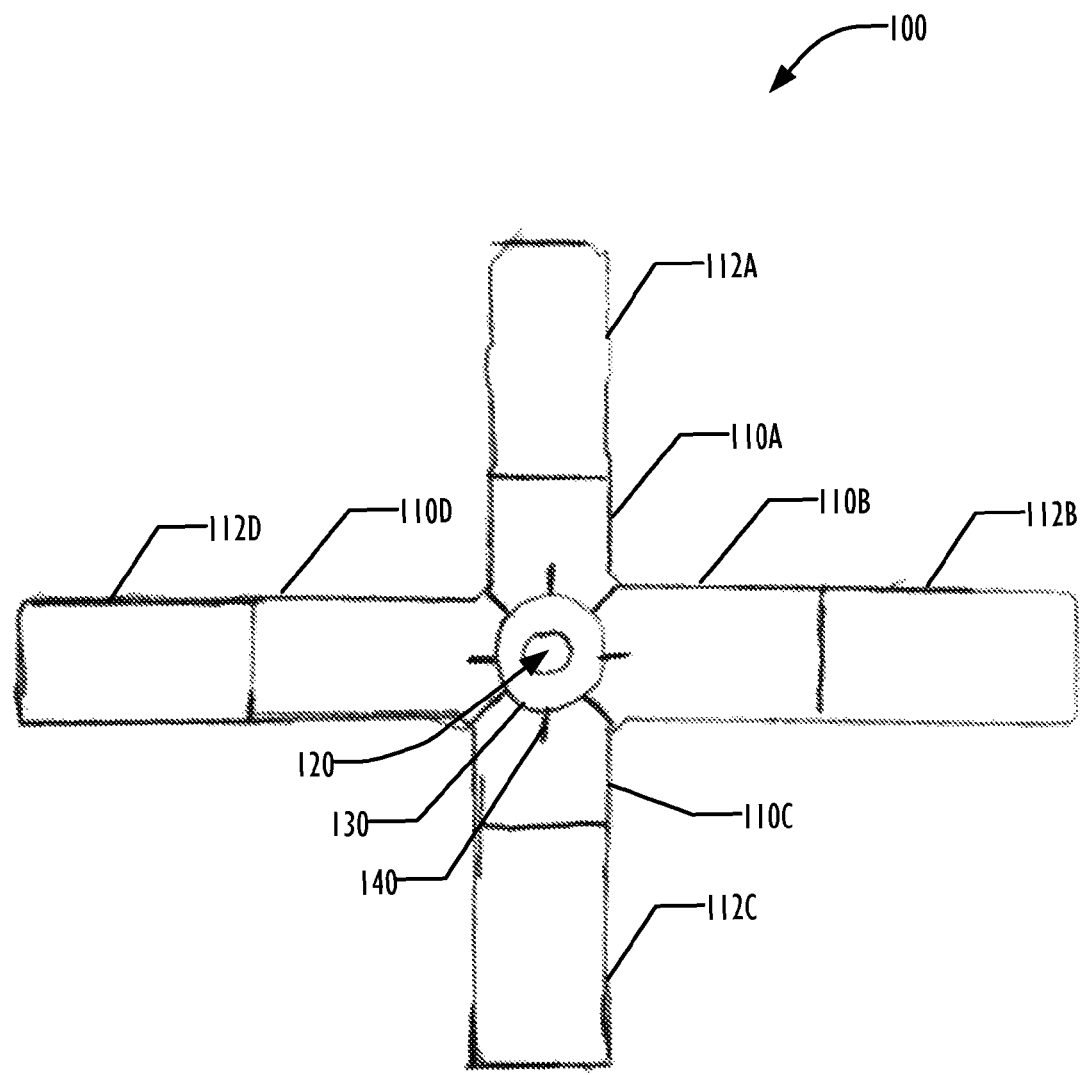
FIG. 1 is a top view of a mounting clip according to one embodiment.

FIG. 1 is a top view of a mounting clip 100 according to one embodiment that provides an improved technique for mounting LED circuit boards in LED light fixtures, allowing easy assembly and replacement. Rather than directly attaching the LED circuit boards to the LED light fixture, mounting clips are attached to the LED light fixture and LED circuit boards can be quickly snapped into place and held in place by the mounting clip, without the bowing or flexing effects of direct mounting. Should the circuit board need to be replaced, it can be simply unclipped from the mounting clip, without needing to unscrew or remove a rivet from the circuit board. The mounting clip can remain in place for the replacement circuit board.

As illustrated in FIG. 1, the mounting clip has four arms (110A-110D), surrounding a central mounting member 130 which has a hole 120 formed through the mounting member 130. Vanes 140 may extend from the mounting member 130 for structural stability as needed. Distal to the central mounting member on each arm 110A-110D is a raised section 112A-112D which provides room for holding the circuit board (not shown in FIG. 1). The mounting clip 100 may be mounted to an LED light fixture using a rivet, screw, or other mounting member extending through the hole 120 of the mounting member 130 to engage with the LED light fixture (not shown in FIG. 1). Any desired technique for mounting the mounting clip to the LED light fixture may be used.

In the embodiment illustrated in FIG. 1, two opposed arms 110A and 110C are shorter than the other two opposed arms 110B and 110D. This allows a single mounting clip 100 to be used with two different inter-circuit board spacing, by engaging two circuit boards with either arms 110A and 110C or arms 110B and 110D. In some embodiments, wires or other elements may be held in place using the alternate arms of the cruciform mounting clip, for example using arms 110A and 110C for holding wires, while using arms 110B and 110D for holding the circuit board. In some embodiments, the mounting clip may be rotatably mounted, so that the inter-circuit board spacing (pitch) may be adjusted by switching between longer arms 110B and 110D and shorter arms 110A and 110C.

Although illustrated in FIG. 1 with four arms in a cruciform configuration, other numbers of arms may be used, including one, two, or any other desired number. For example, a mounting clip may use just arms 110A and 110C, omitting arms 110B and 110D. In some embodiments, the central mounting member 130 may be omitted, depending on the technique used for mounting the mounting clip 100 to the LED light fixture. Although illustrated with one pair of arms 110 being perpendicular to the other pair of arms 110, other angles may be used as desired.

The length of the arms 110 depends on the desired inter-circuit board spacing. Different embodiments of the mounting clip 100 may be manufactured with different arm lengths. Although in FIG. 1 the opposite arms are of the same length, unequal opposed arms 110 may be used if desired. Depending on the light pattern desired, different configurations of mounting clips 100 may be used in the same LED light fixture.

Figure 2:
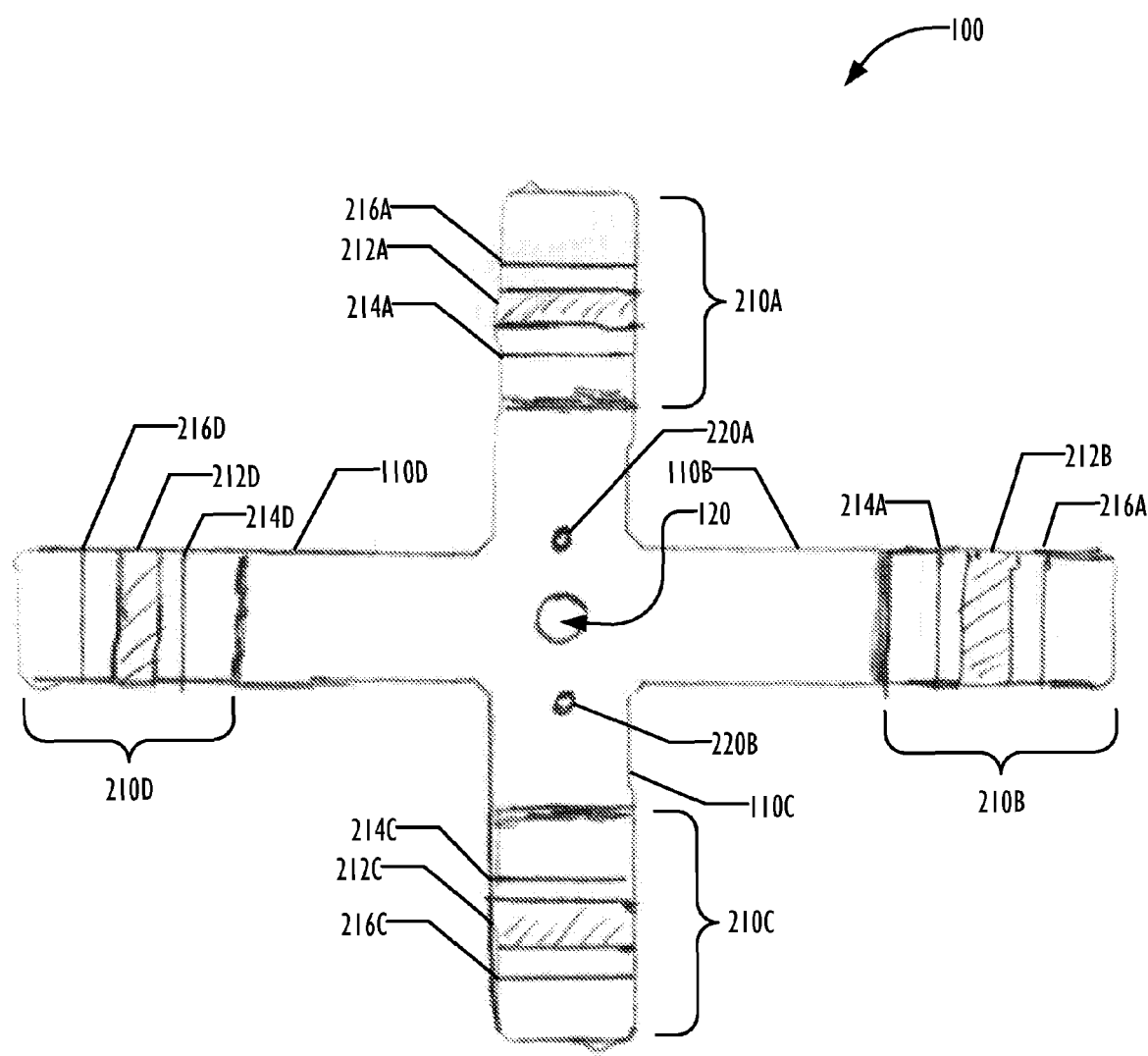
FIG. 2 is a bottom view of the mounting clip of FIG. 1.

FIG. 2 is a bottom view of the mounting clip 100 according to one embodiment. In one embodiment, one or more support members 220 (as illustrated, two pins 220A and 220B) may extend away from a surface of the bottom of the mounting clip 100 about the hole 120. These pins may extend into the mount surface and may prevent the mounting clip from pivoting around hole 120. Other embodiments may use differing numbers of pins, including omitting them. The pins may be any desired length or shape. Typically, the mounting clip may be manufactured using an injection molding process, but desired manufacturing technique may be used.

In one embodiment, the mounting clip may be formed of a plastic material, such as a polyether ether ketone (PEEK) plastic. Other materials may be used, including metal, as long as the material is flexible enough to allow insertion and removal of the circuit board from the raised sections 112.

As illustrated in FIG. 2, each arm 110A-110D has a raised section 210A-210D, corresponding to the raised sections 112A-112D of FIG. 1, In some embodiments, the raised sections 210A-210D have an overall thickness similar to that of the rest of the arms 110A-110D, but are offset from the rest of the arms 110A-110D; in other embodiments the thickness of the raised section is decreased, so that the bottom surface of the raised section 210A-210D is higher (relative to the mounting surface) than the bottom surface of the remainder of the arm 110A-110D.

A rib 212A-212B may be formed in each raised section 212A-212D, extending towards the mounting surface when assembled in the LED light fixture. Typically, the ribs 212A-212D are substantially rectangular, extending across the full width raised section 210A-210D of the arms 110A-110D, but any desired shape and size for the ribs 212A-212D may be used, corresponding to a matching slot on the circuit board (not shown in FIG. 2). For example, instead of a rib extending across the entire width of the raised section, the ribs 212A-212D may extend longitudinally along a portion of the raised sections 210A-212D, or may be circular, elliptical, or of any other desired shape and orientation. Although illustrated in FIG. 2 approximately in the middle of the raised sections 210A-210D, the ribs 212A-212D may be formed at any desired position relative to the raised sections 210A-210D. In one embodiment, the ribs 212A-212B may extend from the raised sections 210A-210D the full depth of the raised sections 210A-212D. In other embodiments, the ribs may have any desired depth sufficient to hold a circuit board in place when engaged with the circuit board. The bottom surface of the ribs 212A-212D may be flat or rounded as desired.

In some embodiments, lines 214A-214D and 216A-216D may extend from the bottom surface of the raised section on either side of the ribs 212A-212D. Lines 214A-214D and 216A-216D provide contact points for the corresponding arms 110A-110D of the mounting clip 100 with the printed circuit board. The lines 214A-214D and 216A-216D provide defined locations for the arms 110A-110D to apply force to the circuit board, to ensure the circuit board is as flat as possible. The lines 214A-214D and 216A-216D are optional and may be omitted if desired.

Figure 3:
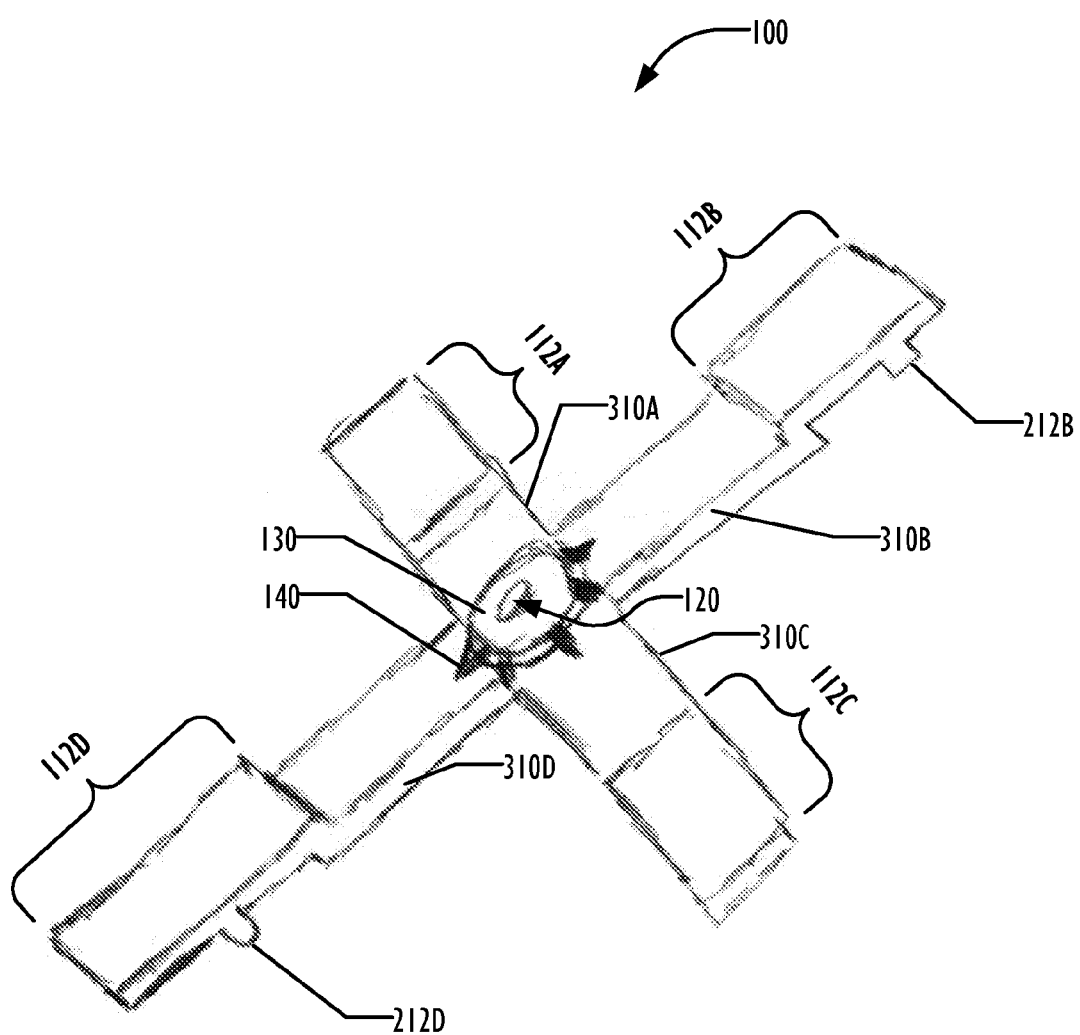
FIG. 3 is a perspective view of the mounting clip of FIG. 1.

FIG. 3 is a perspective view of the mounting clip of FIG. 1 according to one embodiment. In this view, the offset nature of the raised sections 112A-112D relative to the base sections 310A-310D is more clearly illustrated.

Figure 4:
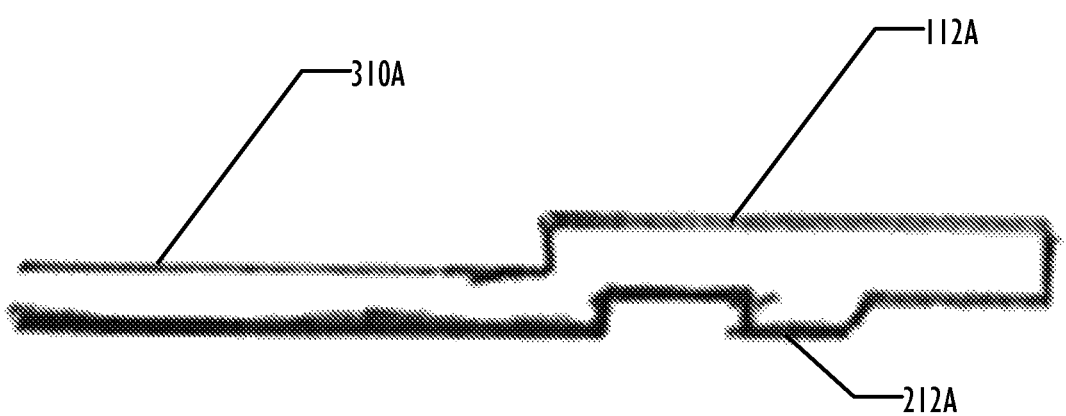
FIG. 4 is a side view of an arm of a mounting clip according to one embodiment.
Figure 5:
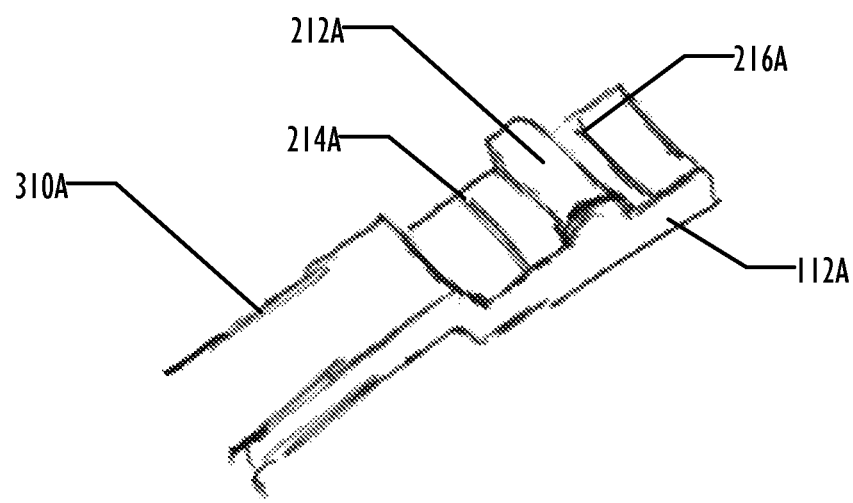
FIG. 5 is a perspective view of the underside of one arm of a mounting clip according to one embodiment.

FIG. 4 is a side view of one of the arms 110A according to one embodiment, illustrating a relative positioning of the base section 310A, the raised section 112A, and rib 212A. Similar positioning may be found in the other arms 110B-110D. However, in some embodiments, mounting clips may be formed with different relative positioning of the base and raised sections 310A-310D and 112A-112D, as well as the sizes, shapes, and orientations of the ribs 212A-212D if desired. FIG. 5 is a perspective view from the bottom of arm 110A, illustrating the base section 310A, raised section 112A, ribs 212A, and lines 214A and 216A.

Figure 6:
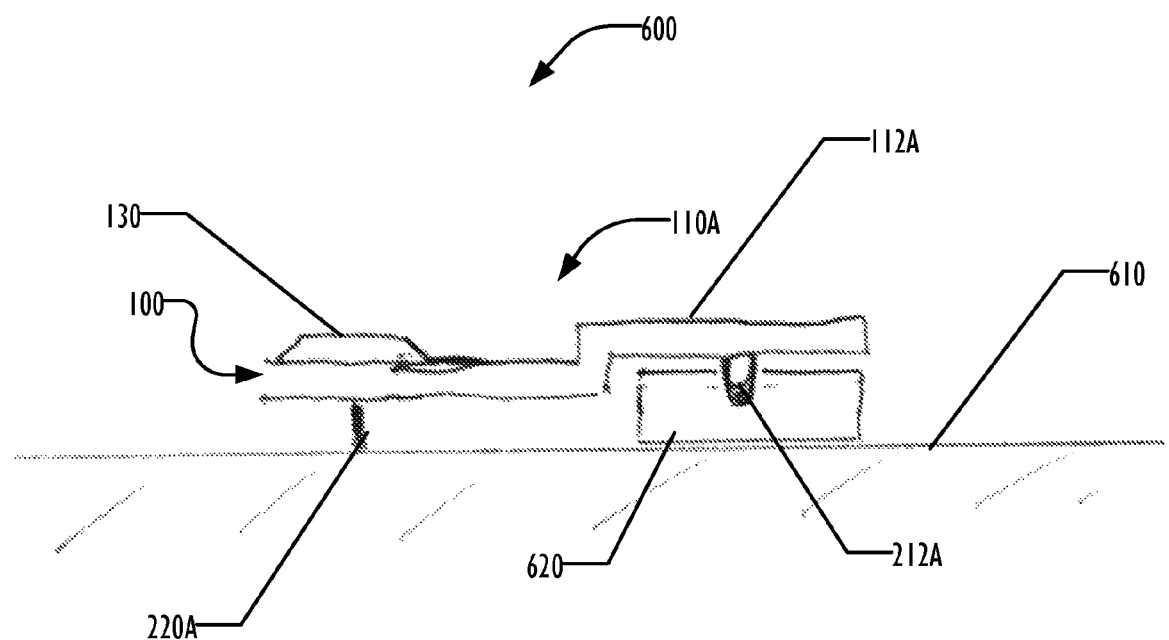
FIG. 6 is a side view of a portion of a mounting clip according to one embodiment engaged with a circuit board.

FIG. 6 is a side view illustrating a portion of an assembly 600 consisting of one arm 110A of the mounting clip 100 of FIGS. 1-5 engaged with a mounting surface 610 of an LED light fixture and a circuit board 620 in partial cutaway. As illustrated in FIG. 6, pin 220A holds the central mounting area of the mounting clip 100 away from the mounting surface 610, while rib 212A engages with a slot (not visible in this view) of the circuit board 620.

Figure 7:
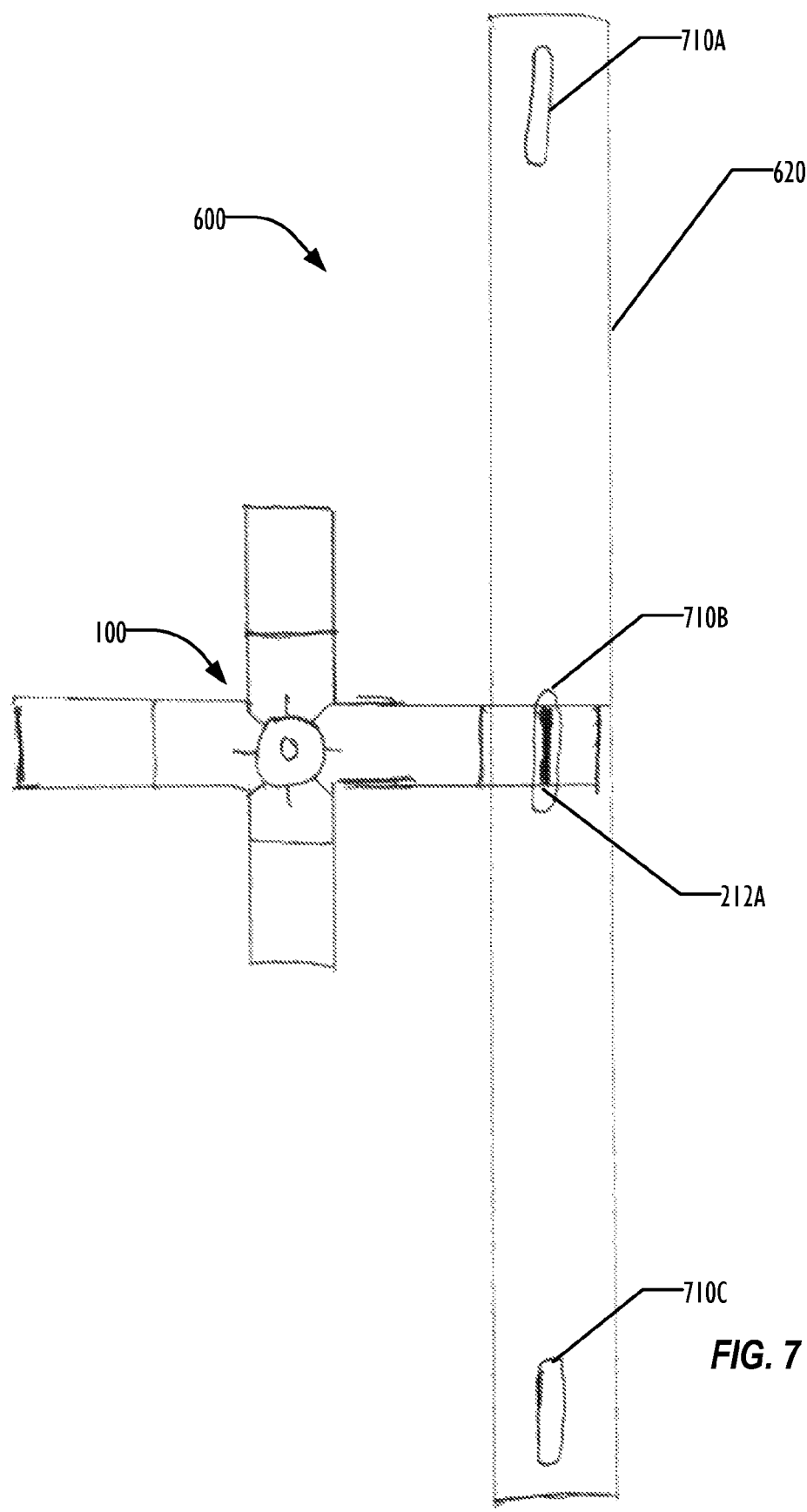
FIG. 7 is a top view of the mounting clip of FIG. 1 engaged with a circuit board according to one embodiment.

FIG. 7, is a top view of the assembly 600 with the rib 212A (which would normally not be visible from this angle) engaging with one of the slots 710A-710C of the circuit board 620. As illustrated in FIG. 7, the circuit board 620 has three approximately rectangular slots formed in circuit board 620. The slots 710A-710C may extend the full depth of the circuit board or may be formed as indentations that do not go fully through the circuit board, as desired. As explained previously, the shape, size, and orientation of the slots 710A-710C approximately match the shape, size, and orientation of the ribs 212A-212D, allowing easy engagement with the mounting clip. Although three slots 710A-710C are illustrated in FIG. 7, any desired number of slots may be used, with longer circuit boards 620 typically having more slots than shorter ones. Other mounting clips may be attached to the LED light fixture mounting surface 610 positioned to engage with the other slots 710A-710C.

FIG. 8 is a cutaway view of an LED light fixture 800, with a rivet 810 extending through the central mounting member and attaching the mounting clip 100 to the mounting surface 610 of the LED light fixture 800. Two circuit boards 620A and 620B are positioned and engaged with arms 110A and 110C of mounting clip 100 by flexing the end of the arm 110A or 110C, typically by lifting the end of the raised section 112A and 112C and sliding the circuit boards 620A, 620B under the raised sections 112A and 112C to engage slots 710A and 710C (not shown in FIG. 8) with the ribs 212A and 212C. To remove one of the circuit boards 620A or 620B, the reverse procedure would be followed: flex the arm 110A or 110C sufficiently to clear the rib 212A or 212C from slots 710A or 710C, then slide the circuit board 620A or 620B out.

Thus, a kit of mounting clips 100 and circuit boards 620 may be provided for mounting to LED light fixtures 800, allowing easy and quick assembly and disassembly as needed, without a need to remove rivets, screws, or other attachment mechanisms that have previously been used to attach circuit boards 620 to mounting surfaces 610. Although if necessary the mounting clips 100 may be removed from the mounting surface 610 and replaced or reattached, in normal operation the mounting clips 100 may remain in place once attached, which circuit boards 620 may be easily inserted or removed as needed or desired without tools.

While certain exemplary embodiments have been described in details and shown in the accompanying drawings, it is to be understood that such embodiments are merely illustrative of and not devised without departing from the basic scope thereof, which is determined by the claims that follow.

I claim:

1. A plastic mounting clip, comprising:
   a plastic flexible first arm, comprising:
      a base section having an upper surface and a lower surface;
      a raised section, having a lower surface that is offset from the lower surface of the base section; and
      a rib extending from an interior portion of the lower surface of the raised section, configured for engagement with a corresponding area of a circuit board; and
   an attachment member disposed at an end of the first arm, distal to the raised section, configured for attaching the plastic mounting clip to a mounting surface.

2. The plastic mounting clip of claim 1, further comprising:
   a plastic flexible second arm, extending from the attachment member, comprising:
      a base section having an upper surface and a lower surface;
      a raised section, having a lower surface that is offset from the lower surface of the base section; and
      a rib extending from an interior portion of the lower surface of the raised section, configured for engagement with a corresponding area of a circuit board.

3. The plastic mounting clip of claim 2, wherein the second arm is perpendicular to the first arm.

4. The plastic mounting clip of claim 2, wherein the second arm has a different length than the first arm.

5. The plastic mounting clip of claim 1, wherein the rib is substantially rectangular.

6. The plastic mounting clip of claim 1 wherein the attachment member comprises a raised member, configured for rivet or screw attachment to the mounting surface.

7. The plastic mounting clip of claim 1, wherein the attachment member comprises a plurality of vanes extending radially from an edge of the attachment member.

8. The plastic mounting clip of claim 1, wherein the attachment member forms a central opening configured for insertion of a rivet or screw.

9. The plastic mounting clip of claim 8, further comprising:
   a plurality of support members extending away from a surface of the plastic mounting clip, configured to support the plastic mounting clip away from the mounting surface.

10. A kit, comprising:
    a plurality of circuit boards, each comprising:
       a plurality of mounting slots, spaced along the circuit board; and
    a plurality of plastic flexible mounting clips, each comprising:
       a mounting member, configured for attaching the plastic flexible mounting clip to a mounting surface;
       a plurality of plastic flexible arms, disposed about the mounting member, each comprising:
          a base section having an upper surface and a lower surface, connected to the mounting member;
          a raised section having a lower surface that is offset from the lower surface of the base section, configured for inserting a circuit board of the plurality of circuit boards between the raised section and the mounting surface; and
          a rib, extending from an interior portion of the lower surface of the raised section, and configured to engage with one of the plurality of mounting slots of a circuit board of the plurality of circuit boards.

11. The kit of claim 10, wherein each circuit board of the plurality of circuit boards comprises a plurality of light emitting diodes, spaced along the circuit board.

12. The kit of claim 10, wherein the mounting surface is a surface of a light fixture.

13. The kit of claim 10, wherein the plurality of plastic flexible arms are disposed in a cruciform configuration about the mounting member.

14. The kit of claim 10, wherein some of the plurality of plastic flexible arms are of a different length than others of the plurality of plastic flexible arms.

15. A method of mounting circuit boards in a fixture, comprising:
    attaching a plastic mounting clip to a mounting surface of the fixture;
    flexing an arm of the plastic mounting clip, allowing insertion of a circuit board between the plastic mounting clip and the mounting surface; and
    engaging a rib extending from an interior portion of a lower surface of the arm of the plastic mounting clip with an opening in the circuit board.

16. The method of claim 15, further comprising:
    disengaging the rib from the opening in the circuit board by flexing the arm of the plastic mounting clip; and
    removing the circuit board.

17. The method of claim 15, further comprising:
    rotating the plastic mounting clip about a central mounting member to position a desired arm of the plastic mounting clip in a desired direction,
    wherein the plastic mounting clip comprises a plurality of arms, some of the plurality of arms having a length different than others of the plurality of arms.

18. The method of claim 15, wherein flexing the arm of the plastic mounting clip and engaging the rib of the arm with an opening in the circuit board are performed without tools.

* * * * *